(12) United States Patent
Bundick et al.

(10) Patent No.: US 10,560,063 B1
(45) Date of Patent: Feb. 11, 2020

(54) HIGH EFFICIENCY S-BAND AMPLIFIER

(71) Applicant: United States of America as represented by the Administrator of NASA, Washington, DC (US)

(72) Inventors: Steven N. Bundick, Pocomoke City, MD (US); Wei-Chung Huang, College Park, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 0 days.

(21) Appl. No.: 16/058,796

(22) Filed: Aug. 8, 2018

(51) Int. Cl.
*H03F 3/191* (2006.01)
*H03F 3/19* (2006.01)
*H03F 1/56* (2006.01)
*H03H 7/38* (2006.01)

(52) U.S. Cl.
CPC .............. *H03F 3/19* (2013.01); *H03F 1/56* (2013.01); *H03H 7/38* (2013.01); *H03F 2200/387* (2013.01); *H03H 2007/386* (2013.01)

(58) Field of Classification Search
CPC ............ H03F 1/56; H03F 3/191; H03F 3/193
USPC ............................................. 330/2, 302, 305
See application file for complete search history.

(56) References Cited

U.S. PATENT DOCUMENTS

| | | | | |
|---|---|---|---|---|
| 2011/0140772 A1* | 6/2011 | Sengupta | ............ | H03F 1/0266 330/2 |
| 2014/0302797 A1* | 10/2014 | Han | ............ | H04W 24/06 455/67.14 |
| 2019/0131940 A1* | 5/2019 | Moise | ............ | H03F 1/56 |

* cited by examiner

*Primary Examiner* — Steven J Mottola
(74) *Attorney, Agent, or Firm* — Christopher O. Edwards; Bryan A. Geurts (57) ABSTRACT

A method of constructing an amplifier circuit includes simulating an output of an amplifier device of the amplifier circuit over a range of impedances to yield a simulated maximum power and a simulated maximum power added efficiency at a particular frequency, fabricating a plurality of output matching networks and input matching networks with impedances above and below the impedances that yield the simulated maximum power and simulated maximum power added efficiency, empirically determining physical dimensions of an optimized output matching network and an optimized input matching network that result in actual impedances that provide an actual maximum power and maximum power added efficiency at the particular frequency, and coupling the optimized output matching network to an output of the amplifier device and coupling the optimized input matching network between an output of a driver circuit and an input of the amplifier device.

13 Claims, 9 Drawing Sheets

| RF Gen Out (dBm) | Pin (dBm) | Driver Circuit 105 Pout (dBm) | Driver Circuit 105 Pout (W) | Amplifier Device 115 Pout (dBm) | Amplifier Device 115 Pout (W) | Amplifier Device 115 Gain (dB) | Amplifier Circuit 100 Overall Gain (dB) | Driver Circuit 105 Current (A) | Amplifier Device 115 Current (A) | Pdc | Amplifier Device 115 PAE (%) | Amplifier Circuit 100 Overall Eff (%) |
|---|---|---|---|---|---|---|---|---|---|---|---|---|
| 8.0 | 7.6 | 21.2 | 0.1 | 37.9 | 6.2 | 16.7 | 30.3 | 0.87 | 0.64 | 22.27 | 33.7 | 27.7 |
| 9.0 | 8.6 | 22.2 | 0.2 | 38.9 | 7.8 | 16.7 | 30.3 | 0.87 | 0.71 | 24.23 | 38.2 | 32.0 |
| 10.0 | 9.6 | 23.3 | 0.2 | 39.8 | 9.5 | 16.5 | 30.2 | 0.86 | 0.80 | 26.70 | 41.7 | 35.8 |
| 11.0 | 10.6 | 24.3 | 0.3 | 40.7 | 11.7 | 16.4 | 30.1 | 0.86 | 0.89 | 29.22 | 46.1 | 40.2 |
| 12.0 | 11.6 | 25.3 | 0.3 | 41.7 | 14.8 | 16.4 | 30.1 | 0.86 | 1.00 | 32.30 | 51.6 | 45.8 |
| 13.0 | 12.7 | 26.4 | 0.4 | 42.6 | 18.2 | 16.2 | 29.9 | 0.86 | 1.13 | 35.94 | 56.1 | 50.6 |
| 14.0 | 13.7 | 27.5 | 0.6 | 43.5 | 22.4 | 16.0 | 29.8 | 0.87 | 1.27 | 39.91 | 61.4 | 56.1 |
| 15.0 | 14.8 | 28.6 | 0.7 | 44.1 | 25.7 | 15.5 | 29.3 | 0.88 | 1.39 | 43.32 | 64.2 | 59.3 |
| 16.0 | 16.0 | 29.9 | 1.0 | 44.6 | 28.8 | 14.7 | 28.6 | 0.91 | 1.50 | 46.55 | 66.3 | 62.0 |
| 17.0 | 17.4 | 31.4 | 1.4 | 45.0 | 31.6 | 13.6 | 27.6 | 0.99 | 1.60 | 49.75 | 67.5 | 63.6 |

//-
HIGH EFFICIENCY S-BAND AMPLIFIER

INVENTION BY GOVERNMENT EMPLOYEE(S) ONLY

The invention described herein was made by one or more employees of the United States Government, and may be manufactured and used by or for the Government for governmental purposes without the payment of any royalties thereon or therefor.

BACKGROUND

Many commercial, broad bandwidth amplifiers are not optimized for efficiency at specific S-band frequencies. In particular, amplifiers capable of use in the 2200 to 2300 MHz range, if available at all, are relatively inefficient and typically utilize custom or hard to obtain components. When used in transmitter applications, the general inefficiency of the available amplifiers limits the available RF transmit power and the data throughput, in particular for power constrained, balloon and space based applications.

SUMMARY

The disclosed embodiments are directed to a method of constructing an amplifier circuit, including simulating an output of an amplifier device of the amplifier circuit over a range of impedances to yield a simulated maximum power and a simulated maximum power added efficiency at a particular frequency, fabricating a plurality of output matching networks and input matching networks with impedances above and below the impedances that yield the simulated maximum power and simulated maximum power added efficiency, empirically determining physical dimensions of an optimized output matching network and an optimized input matching network that result in actual impedances that provide an actual maximum power and maximum power added efficiency at the particular frequency, and coupling the optimized output matching network to an output of the amplifier device and coupling the optimized input matching network between an output of a driver circuit and an input of the amplifier device.

The disclosed embodiments are also directed to an amplifier circuit, including a plurality of output matching networks and input matching networks fabricated with impedances above and below impedances that yield a simulated maximum power and a simulated maximum power added efficiency at a particular frequency, the impedances determined by simulating an output of an amplifier device of the amplifier circuit over a range of simulated impedances, an optimized output matching network and an optimized input matching network with empirically determined physical dimensions with actual impedances that provide an actual maximum power and maximum power added efficiency at the particular frequency, and an output of the amplifier device coupled to the optimized output matching network to and an output of a driver circuit and an input of the amplifier device between which the optimized input matching network is coupled.

BRIEF DESCRIPTION OF THE DRAWINGS

The foregoing aspects and other features of the embodiments are explained in the following description, taken in connection with the accompanying drawings, wherein.

DETAILED DESCRIPTION

Although the disclosed embodiments will be described with reference to the embodiments shown in the drawings and described below, it should be understood that these could be embodied in many alternate forms. In addition, any suitable size, shape or type of elements or materials could be used.

The disclosed embodiments generally relate to an amplifier device optimized for a specific frequency range, which may be more suitable for applications where available power may be limited, such as space applications. The optimization results in a more efficient use of power and an optimized output for the specific frequency range.

Figure 1:
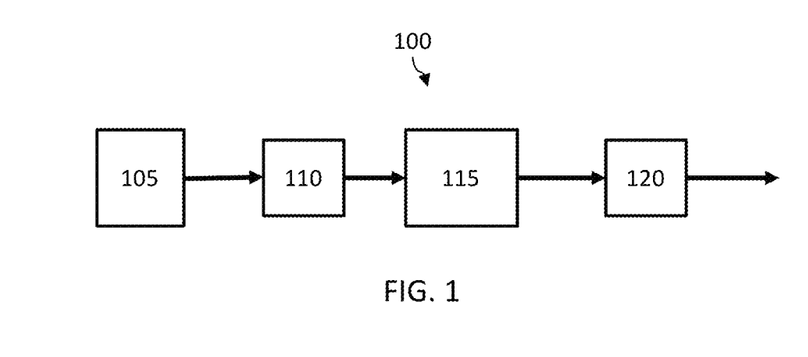
FIG. 1 shows a schematic block diagram of an amplifier circuit according to the disclosed embodiments.

FIG. 1 shows a schematic block diagram of an amplifier circuit 100 according to the disclosed embodiments. The amplifier circuit 100 includes a driver circuit 105, an input matching network 110, an amplifier device 115, and an output matching network 120.

The driver circuit 105 may be a Gallium Arsenide enhancement Mode Pseudomorphic High Electron Mobility Transistor (GaAs E-pHEMT), implemented as a linear power amplifier operating at approximately 2 watts. While the disclosed embodiments are described as using a GaAs E-pHEMT device in the driver circuit 105, and device may be suitable for such use, so long as it is capable of operating linearly in the range of 1 watt at the frequencies and applicable impedances described herein.

The disclosed embodiments describe the use of a Gallium Nitride on Silicon Carbide High Electron Mobility Transistor (GaN on SiC HEMT), as the amplifier device 115, however, it should be understood that any device may be utilized that may continuously dissipate at least 30 watts of power and withstand a constant channel temperature of at least 220° C., while operating at the frequencies and efficiencies described herein.

A commercially available model may be obtained, or a model may be custom programmed for the amplifier device 115. Load pull may be performed on the model to determine the output power, efficiency and gain that may be obtained from the amplifier device 115, and to determine the optimal load impedance. For the amplifier device 115 of the disclosed embodiments, load pull may be simulated at a frequency of 2280 Mhz, with the objective of delivering at least 20 watts of power while maximizing power added efficiency (PAE). During load pull, a swept range of load impedances may be presented to the amplifier device 115 while performance specifications are measured or simulated.

Figure 2:
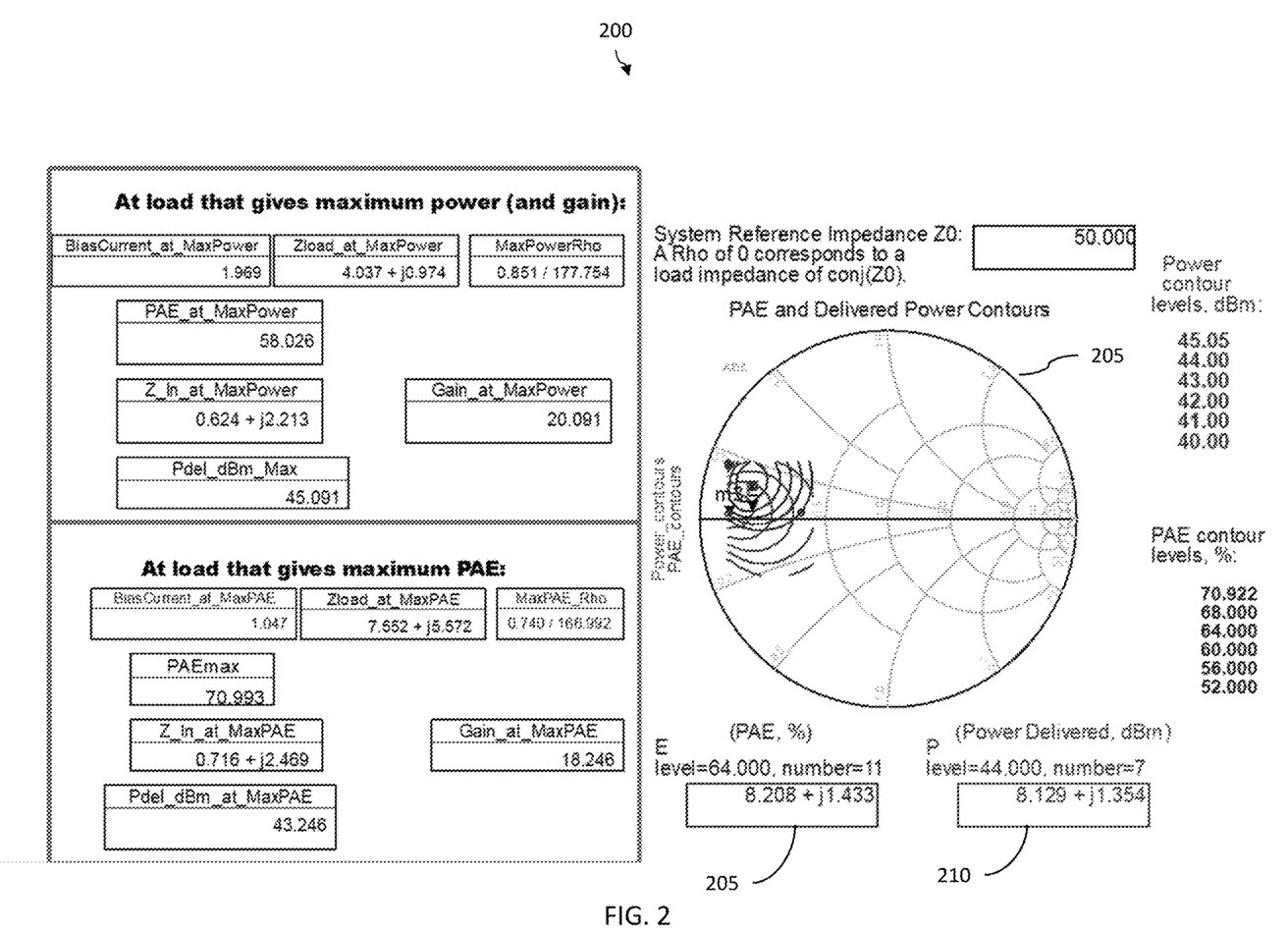
FIG. 2 shows exemplary results of a load pull analysis of an amplifier device according to the disclosed embodiments.

FIG. 2 shows exemplary results 200 of the load pull analysis of the amplifier device 115 at 2280 Mhz, where an input impedance of 0.624+j2.213 and a load of 4.037+j0.974 yields maximum power and gain, and an input impedance of 0.716+j2.469 and a load of 7.552+j5.572 yields maximum PAE. The results 200 also include a Smith Chart 205 showing the power and PAE contours for the swept range of load impedances.

Figure 3:
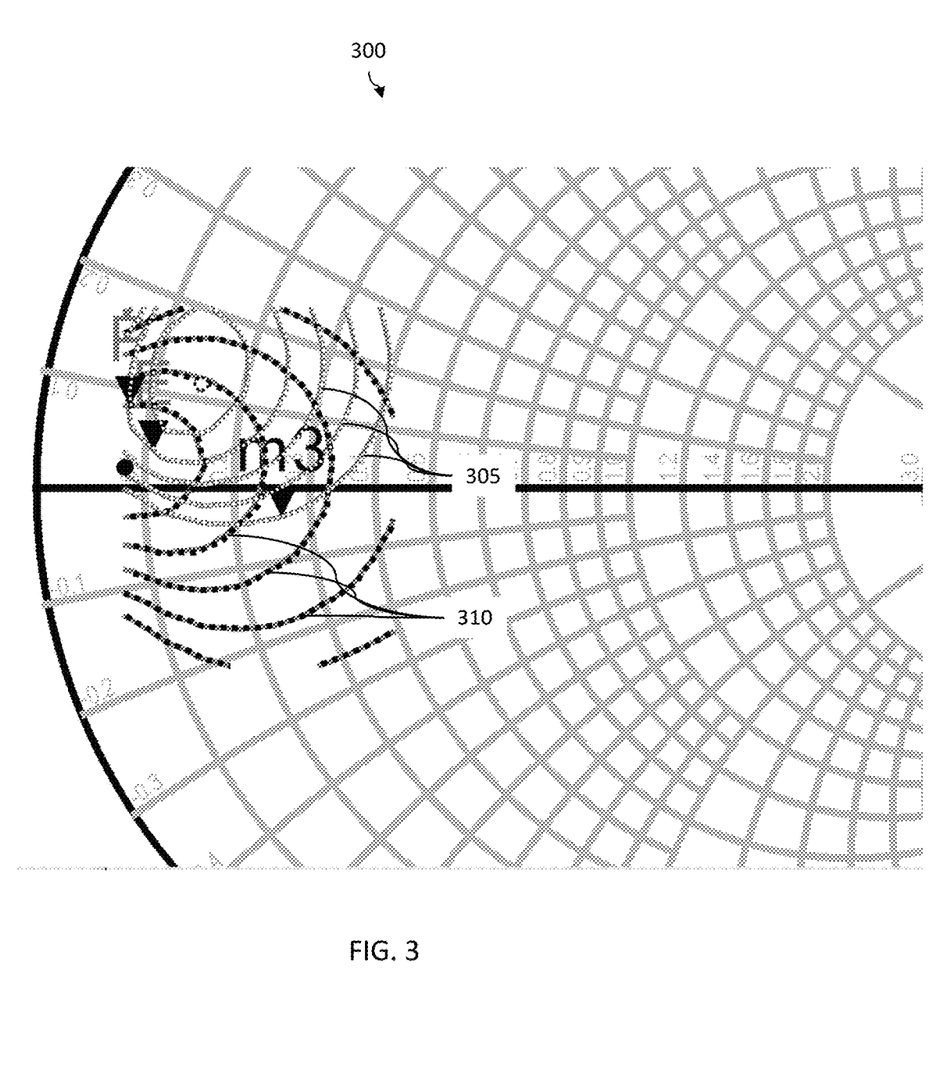
FIG. 3 shows an expanded view a Smith Chart illustrating PAE contours and power contours of the amplifier device.

FIG. 3 shows an expanded view 300 of the Smith chart 205 more clearly illustrating the PAE contours 305 and the power contours 310.

Figure 4:
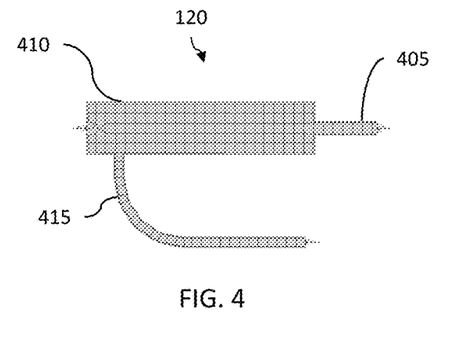
FIG. 4 shows an exemplary output matching network transmission line derived from the load pull analysis.
Figure 5:
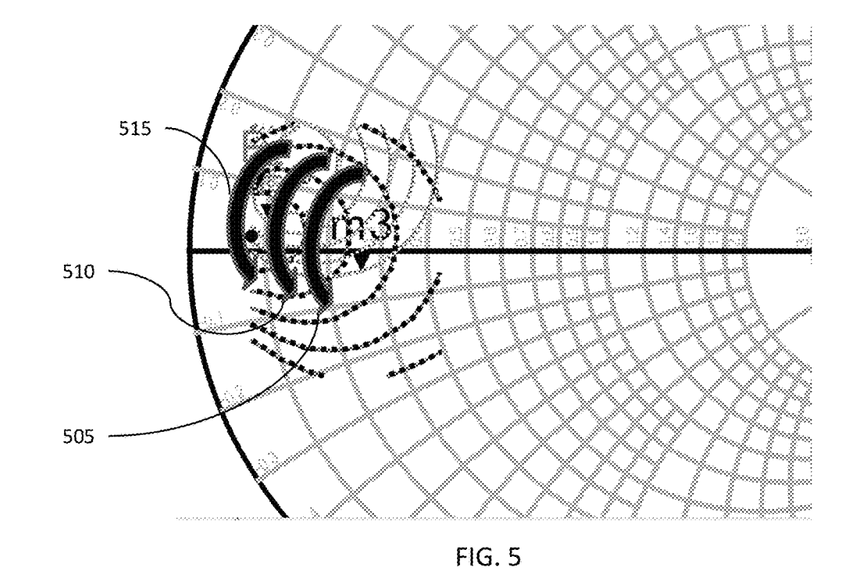
FIG. 5 shows different output network matching network transmission line impedances around target results shown on the Smith Chart.

FIG. 4 shows an exemplary output matching network transmission line 120 derived from the load pull analysis. A 50 ohm transmission line section 405 is attached to a transformer section 410 that results in an impedance that falls somewhere between the PAE % (FIG. 2, 205) and power delivered in dBm (FIG. 2, 210) shown in the results. A ¼ wave drain feed 415 is attached to the transformer section 410. Generally, the characteristics of simulated matching networks may not exactly match those of as built matching networks. As shown in FIG. 5, in order to achieve optimum results, multiple output matching network transmission lines were fabricated with different transformer section widths and thus different impedance intervals 505, 510, 515 around the target results shown on the Smith Chart. As the transformer section 410 widths increase, the load impedances $Z_L$ shown by the arrows 505, 510, 515, decrease and move to the left of the Smith Chart. For a particular transformer section width, as the length of the output matching network transmission line 400 is shortened, the load impedance $Z_L$ moves counterclockwise along the respective arrow 505, 510, 515.

Figures 6, 7:
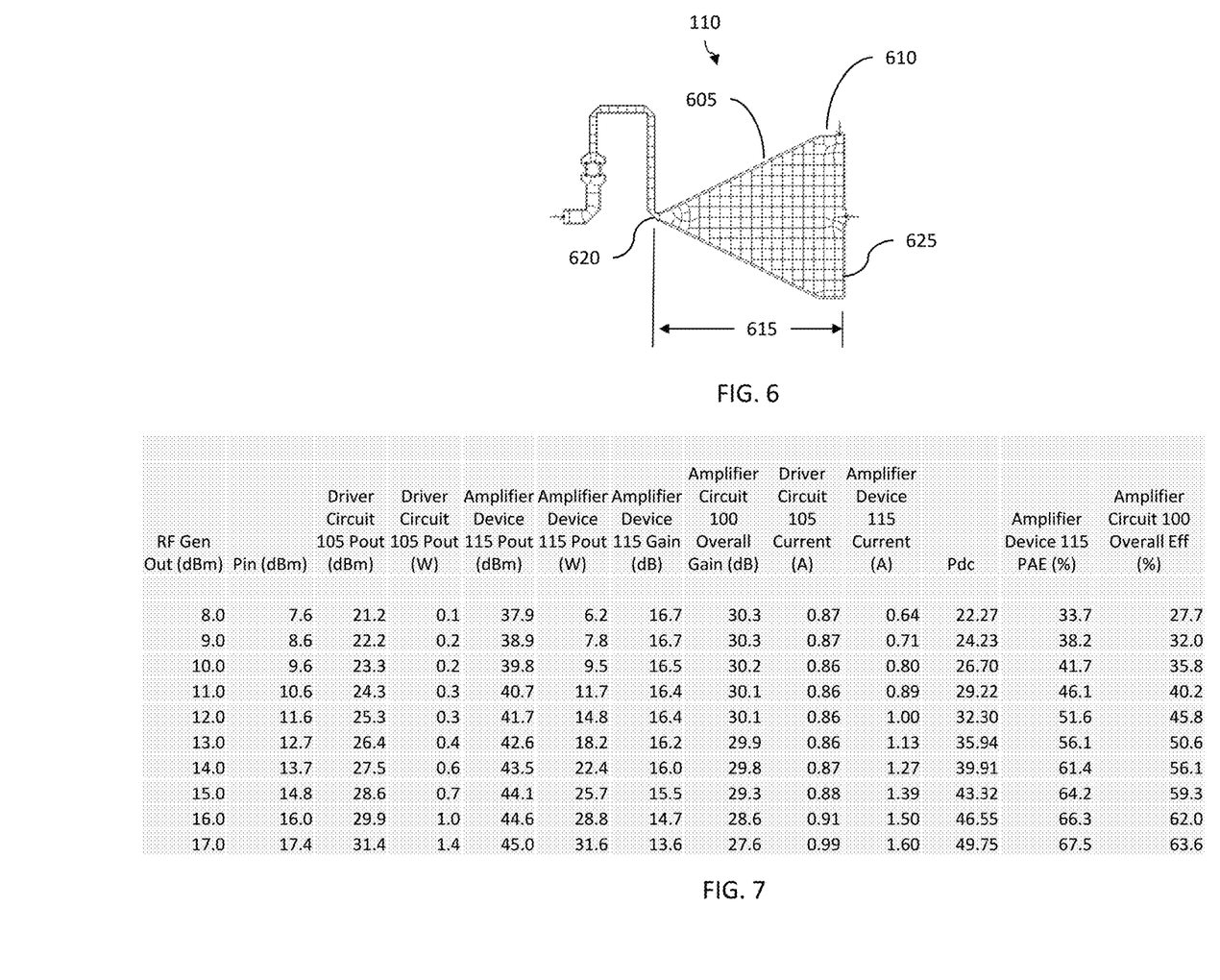
FIG. 6 shows an exemplary input matching network derived from a simulation using an optimum load impedance from the load pull analysis and S-parameters of the amplifier device.
FIG. 7 shows the results obtained when utilizing the optimum output and input matching network configurations.

FIG. 6 shows an exemplary input matching network 110 derived from a simulation using the optimum $Z_L$ from the load pull analysis and S-parameters of the amplifier device 115. In this embodiment, the input matching network includes an isosceles triangular structure 605 with a base centered on a rectangular shaped structure 610 with a height dimension 615 in the range of 550 mils, extending from the apex 620 of the triangle shaped structure to the distal end 625 of the rectangular structure 610. As stated above, the characteristics of simulated matching networks may not exactly match those of as built matching networks, and in order to determine an optimum input matching network, input matching networks were simulated at 40 Mhz intervals above and below 2290 Mhz, and the results were used to fabricate a series of input matching networks with different dimensions reflecting the 40 Mhz interval simulations.

Different combinations of the output matching network transmission lines fabricated with different transformer section 410 impedances, and input matching networks fabricated with different dimensions based on the optimum simulated 40 Mhz intervals, were used to empirically determine an optimum output matching network and optimum input matching network combination that produced an amplifier device PAE of greater than 67%, and an overall amplifier circuit efficiency of greater than 63%.

FIG. 7 shows the results obtained when utilizing the optimum output and input matching network configurations.

Figure 8:
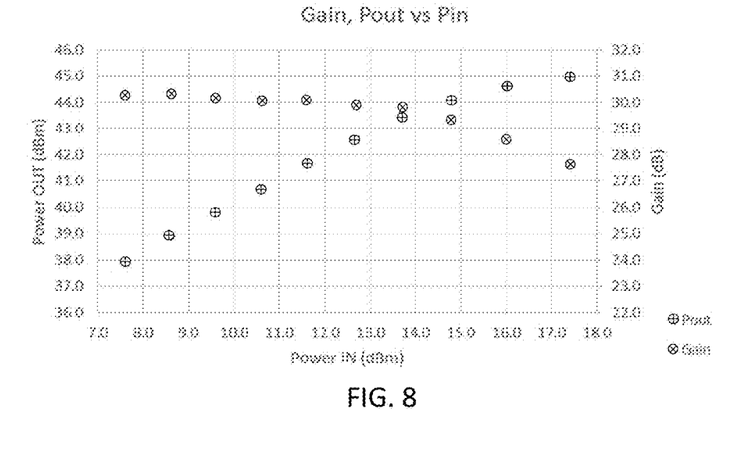
FIG. 8 shows a graph of the gain, and power out v. power in of the results shown in FIG. 7.
Figure 9:
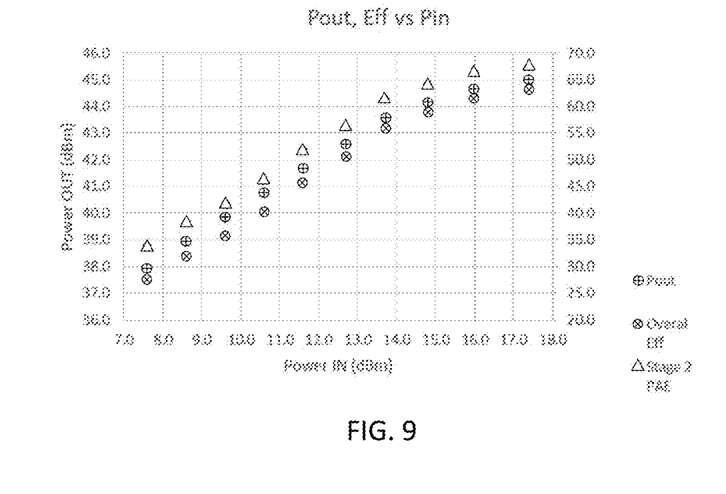
FIG. 9 shows a graph of the power out and efficiency v. power in of the results shown in FIG. 7.

FIG. 8 shows a graph of the gain, and power out v. power in of the results shown in FIG. 7, while FIG. 9 shows a graph of the power out and efficiency v. power in of the results shown in FIG. 7.

Figure 10:
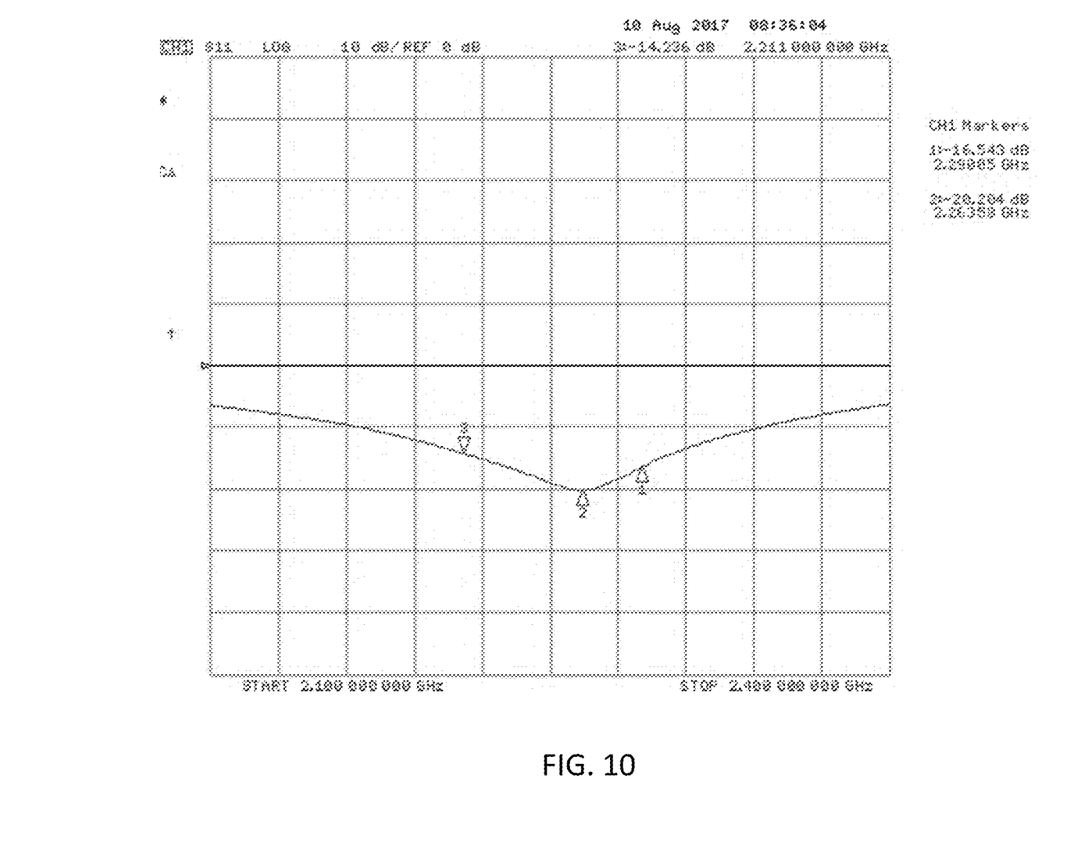
FIG. 10 shows the small signal S11 results of the amplifier device in combination with the selected output matching network.
Figure 11:
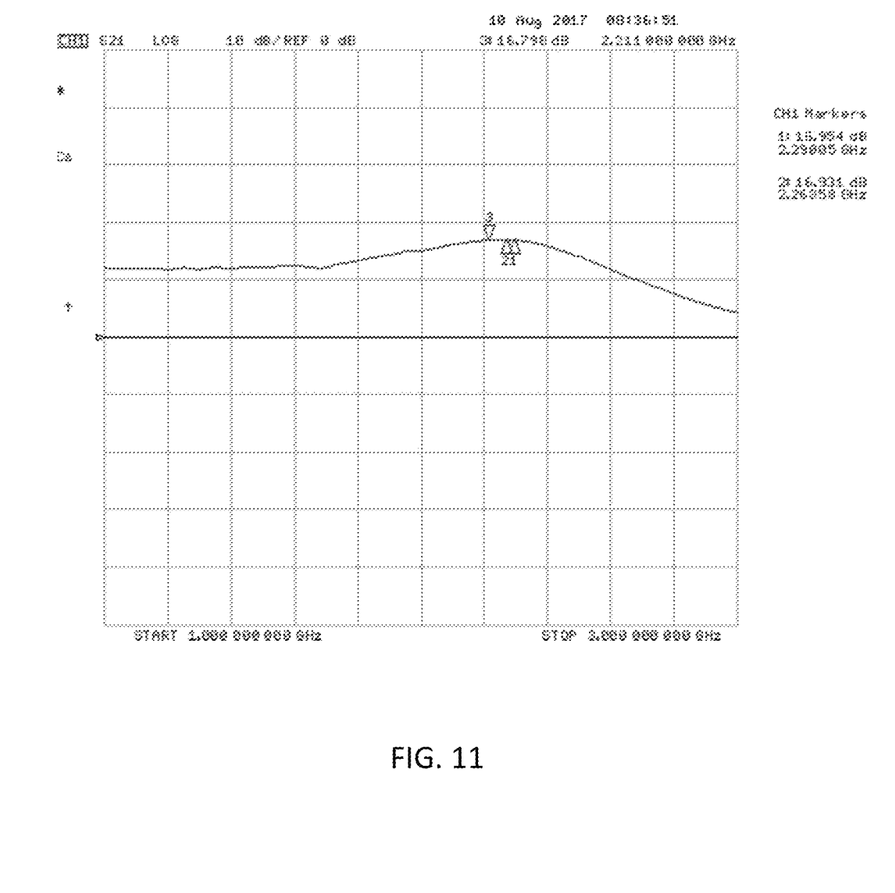
FIG. 11 shows the small signal S12 results of the amplifier device in combination with the selected output matching network.

FIG. 10 shows the small signal S11 results of the amplifier device 115 in combination with the optimum output matching network 120, and FIG. 11 shows the small signal S12 results of the amplifier device 115 in combination with the optimum output matching network 120.

Figure 12:
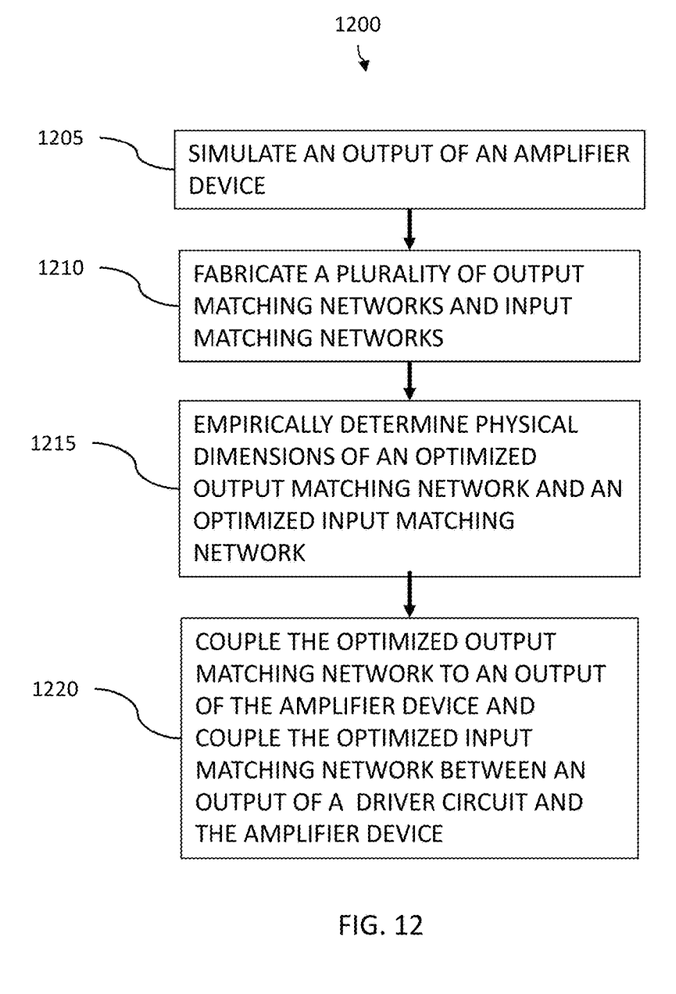
FIG. 12 shows a flow diagram of a process for constructing an amplifier circuit according to the disclosed embodiments.

FIG. 12 shows a flow diagram 1200 of a process for constructing an amplifier circuit according to the disclosed embodiments. In block 1205, an output of an amplifier device of an amplifier circuit is simulated over a range of impedances to yield a simulated maximum power and a simulated maximum power added efficiency at a particular frequency. In block 1210, a plurality of output matching networks and input matching networks are fabricated with impedances above and below the impedances that yield the simulated maximum power and simulated maximum power added efficiency. In block 1'215, physical dimensions of an optimized output matching network and an optimized input matching network that result in actual impedances that provide an actual maximum power and maximum power added efficiency at the particular frequency are empirically determined. In block 1220, the optimized output matching network is coupled to an output of the amplifier device and the optimized input matching network is coupled between an output of a driver circuit and an input of the amplifier device.

The disclosed amplifier circuit 100 provides improved power efficiency at specific frequencies around 2280 Mhz, with a minimum output power of approximately 20 watts and a PAE of greater than approximately of 65% for the amplifier device 115 in combination with the optimum output matching network 120.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

Various modifications and adaptations may become apparent to those skilled in the relevant arts in view of the foregoing description, when read in conjunction with the accompanying drawings. However, all such and similar modifications of the teachings of the disclosed embodiments will still fall within the scope of the disclosed embodiments.

Various features of the different embodiments described herein are interchangeable, one with the other. The various described features, as well as any known equivalents can be mixed and matched to construct additional embodiments and techniques in accordance with the principles of this disclosure.

Furthermore, some of the features of the exemplary embodiments could be used to advantage without the corresponding use of other features. As such, the foregoing description should be considered as merely illustrative of the principles of the disclosed embodiments and not in limitation thereof.

The invention claimed is:

1. A method of constructing an amplifier circuit, comprising:
    simulating an output of an amplifier device of the amplifier circuit over a range of impedances to yield a simulated maximum power and a simulated maximum power added efficiency at a particular frequency;
    fabricating a plurality of output matching networks and input matching networks with impedances above and below the impedances that yield the simulated maximum power and simulated maximum power added efficiency;
    empirically determining physical dimensions of an optimized output matching network and an optimized input matching network that result in actual impedances that provide an actual maximum power and maximum power added efficiency at the particular frequency;
    coupling the optimized output matching network to an output of the amplifier device and coupling the optimized input matching network between an output of a driver circuit and an input of the amplifier device; and
    further comprising using a load pull to simulate the output of the amplifier device over the range of impedances to yield the simulated maximum power and the simulated maximum power added efficiency.

2. The method of claim 1, further comprising using a gallium nitride on silicon carbide high electron mobility transistor as the amplifier device.

3. The method of claim 1, further comprising using a commercial model of the amplifier device as an input to the load pull.

4. The method of claim 1, further comprising using a custom programmed model of the amplifier device as an input to the load pull.

5. The method of claim 1, wherein simulating the output of the amplifier yields an input impedance of 0.624+j2.213 and a load impedance of 4.037+j0.974 at the simulated maximum power and gain, and yields an input impedance of 0.716+j2.469 and a load impedance of 7.552+j5.572 at the maximum power added efficiency.

6. The method of claim 1, wherein the optimized output matching network and optimized input matching network in combination produce an amplifier device power added efficiency of greater than 67%, and an overall amplifier circuit efficiency of greater than 63%.

7. The method of claim 1, further comprising using a gallium arsenide enhancement mode pseudomorphic high electron mobility transistor in the driver circuit.

8. A an amplifier circuit, comprising:
    a plurality of output matching networks and input matching networks fabricated with impedances above and below impedances that yield a simulated maximum power and a simulated maximum power added efficiency at a particular frequency, the impedances determined by simulating an output of an amplifier device of the amplifier circuit over a range of simulated impedances;
    an optimized output matching network and an optimized input matching network with empirically determined physical dimensions with actual impedances that provide an actual maximum power and maximum power added efficiency at the particular frequency; and
    an output of the amplifier device coupled to the optimized output matching network to and an output of a driver circuit and an input of the amplifier device between which the optimized input matching network is coupled;
    wherein the simulated maximum power and the simulated maximum power added efficiency are the result of a load pull simulation.

9. The amplifier circuit of claim 8, wherein the amplifier device is a gallium nitride on silicon carbide high electron mobility transistor.

10. The amplifier circuit of claim 8, wherein an input to the load pull comprises a commercial model of the amplifier device.

11. The amplifier circuit of claim 8, wherein the impedances determined by simulating an output of an amplifier device of the amplifier circuit over a range of simulated impedances comprise an input impedance of 0.624+j2.213 and a load impedance of 4.037+j0.974 at the simulated maximum power and gain, and an input impedance of 0.716+j2.469 and a load impedance of 7.552+j5.572 at the maximum power added efficiency.

12. The amplifier circuit of claim 8, wherein the optimized output matching network and optimized input matching network in combination produce an amplifier device power added efficiency of greater than 67%, and an overall amplifier circuit efficiency of greater than 63%.

13. The amplifier circuit of claim 8, wherein the driver circuit comprises a gallium arsenide enhancement mode pseudomorphic high electron mobility transistor.

* * * * *